(12) United States Patent
Hinkov et al.

(10) Patent No.: US 6,794,797 B2
(45) Date of Patent: Sep. 21, 2004

(54) DEVICE FOR DEFLECTING OPTICAL BEAMS

(75) Inventors: Vladimir Hinkov, Kirchzarten (DE); Iliyana Hinkov, Kirchzarten (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 10/312,925

(22) PCT Filed: May 11, 2001

(86) PCT No.: PCT/DE01/01813

§ 371 (c)(1), (2), (4) Date: Apr. 8, 2003

(87) PCT Pub. No.: WO02/03120

PCT Pub. Date: Jan. 10, 2002

(65) Prior Publication Data

US 2003/0168934 A1 Sep. 11, 2003

(30) Foreign Application Priority Data

Jun. 30, 2000 (DE) .......................... 100 31 877

(51) Int. Cl.[7] ............................................. H01L 41/083
(52) U.S. Cl. ........................................ 310/331; 310/332
(58) Field of Search ................................. 310/330–332

(56) References Cited

U.S. PATENT DOCUMENTS

| | | | |
|---|---|---|---|
| 3,422,570 A | * 1/1969 | Borst Gijsbertus et al. ..... 47/55 |
| 4,385,798 A | 5/1983 | Yevick | |
| 4,491,761 A | 1/1985 | Gradkowski et al. | |
| 4,533,849 A | * 8/1985 | Schnell ........................ 310/330 |
| 4,736,132 A | * 4/1988 | Culp ............................ 310/333 |
| 4,812,698 A | 3/1989 | Chida et al. | |
| 5,001,681 A | 3/1991 | Bertoldi et al. | |
| 5,052,777 A | * 10/1991 | Ninnis et al. ................... 385/19 |
| 5,170,089 A | * 12/1992 | Fulton ......................... 310/328 |
| 5,225,731 A | 7/1993 | Owen | |
| 5,589,084 A | * 12/1996 | Ji et al. ......................... 216/24 |
| 5,613,022 A | * 3/1997 | Odhner et al. ................ 385/37 |
| 5,661,611 A | * 8/1997 | Kim et al. .................... 359/871 |
| 5,715,337 A | 2/1998 | Spitzer et al. | |
| 5,735,026 A | * 4/1998 | Min ........................... 29/25.35 |
| 5,994,821 A | 11/1999 | Imada et al. | |

FOREIGN PATENT DOCUMENTS

| | | | |
|---|---|---|---|
| EP | 0 661 874 | 7/1995 | ............ H04N/5/74 |
| JP | 2-249903 | * 10/1990 | ............ G01B/11/24 |
| JP | 3-208007 | * 9/1991 | ............ G02B/26/08 |
| JP | 05-231815 | 9/1993 | ............ G01B/7/34 |
| JP | 7-64019 | * 3/1995 | ............ G02B/27/20 |
| JP | 2000-19446 | * 1/2000 | ............ G02B/26/10 |

* cited by examiner

Primary Examiner—Thomas M. Dougherty
(74) Attorney, Agent, or Firm—Baker & Daniels

(57) ABSTRACT

The invention relates to a device for the reflection of optical beams (25), provided with a piezo-plate (14), which has piezo-electric regions (15, 16), controlled by piezo electrodes (20, 21). At least one end section (22) of the piezo plate (14) is free of piezo electrodes (20, 21), whereby said free end section (22) is of a size, corresponding to the dimensions of the beams falling thereon. A deflection is thus achieved which leaves the wavefronts of the beams (25) essentially undisturbed.

9 Claims, 8 Drawing Sheets

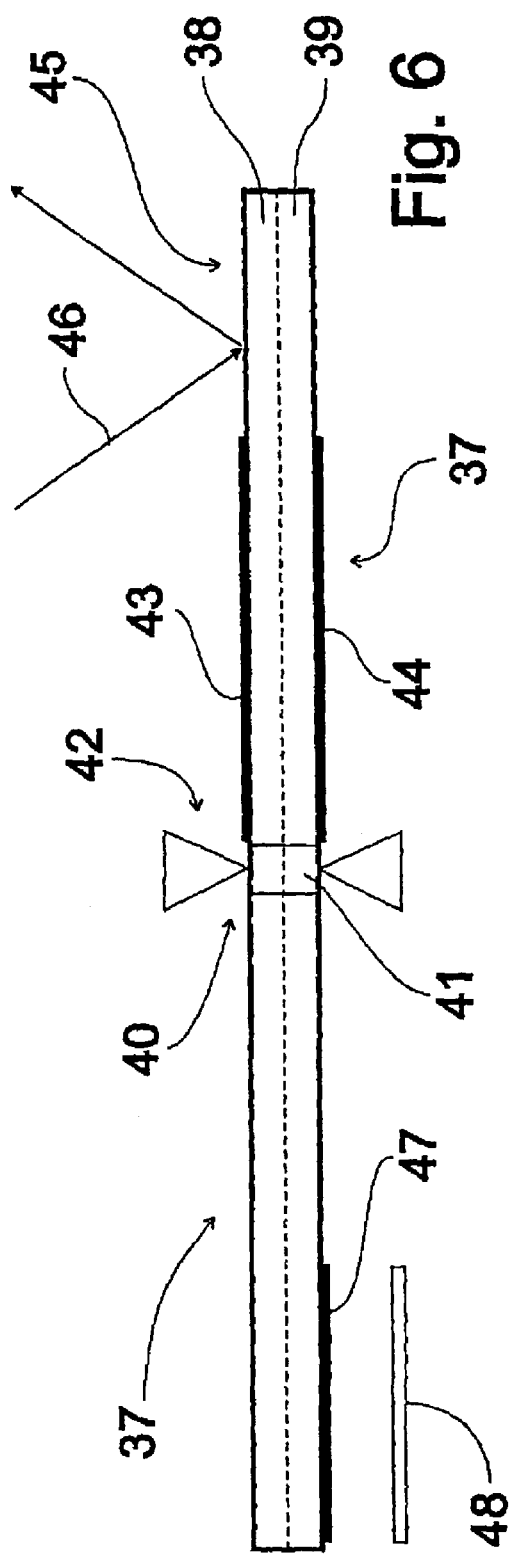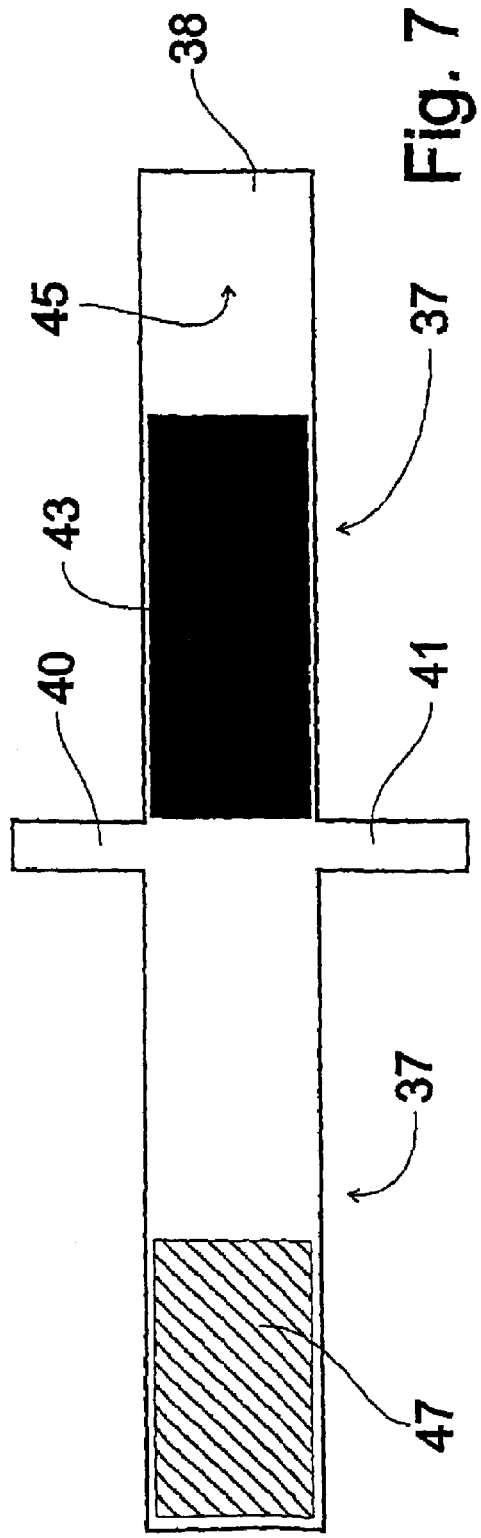

DEVICE FOR DEFLECTING OPTICAL BEAMS

BACKGROUND OF THE INVENTION

The invention concerns a device for deflecting optical beams, comprising a piezo plate having piezoelectric regions and comprising piezo electrodes, disposed on surfaces, to drive said piezo plate.

A device of this kind is known from the article "Piezoelectric bimorph optical beam scanners: analysis and construction," by J. Kelly Lee, published in Applied Optics, Vol. 18. No. 4, pp. 454–459. In this prior device, a mirror is mounted on a piezo plate. When the device is driven by piezo electrodes with a control voltage in the medium voltage range, the mirror moves as a result of the flexure induced in the piezo plate. A disadvantage of this device is the comparatively high mass that must be moved, which is an obstacle to rapid drive.

The object of the invention is to provide a device of the first-cited type that is distinguished by rapid drivability and distortion-free deflection.

SUMMARY OF THE INVENTION

This object is achieved according to the invention in a device of the first-cited type by the fact that the piezo plate is free of piezo electrodes in at least an end portion.

Because there are no piezo electrodes in an end portion of the piezo plate, no flexure is induced in that end portion, which instead remains substantially planar. If the electrode-free end portion is dimensioned to be relatively large compared to the dimensions of the beams incident thereon, reflection or transmission by the end portion will result in little or no distortion of the wave fronts and thus of the beam characteristic, especially the divergence.

BRIEF DESCRIPTION OF THE DRAWINGS

The above-mentioned and other features and advantages of this invention, and the manner of attaining them, will become more apparent and the invention itself will be better understood by reference to the following description of embodiments of the invention taken in conjunction with the accompanying drawings, wherein:

FIG. 6 is a side view of a fifth exemplary embodiment of the invention, comprising a piezo plate having two arms for mounting purposes;

FIG. 7 is a plan view of the embodiment of FIG. 6;

Corresponding reference characters indicate corresponding parts throughout the several views. The exemplifications set out herein illustrate preferred embodiments of the invention, in one form, and such exemplifications are not to be construed as limiting the scope of the invention in any manner.

DESCRIPTION OF THE PREFERRED EMBODIMENT

Figure 1:
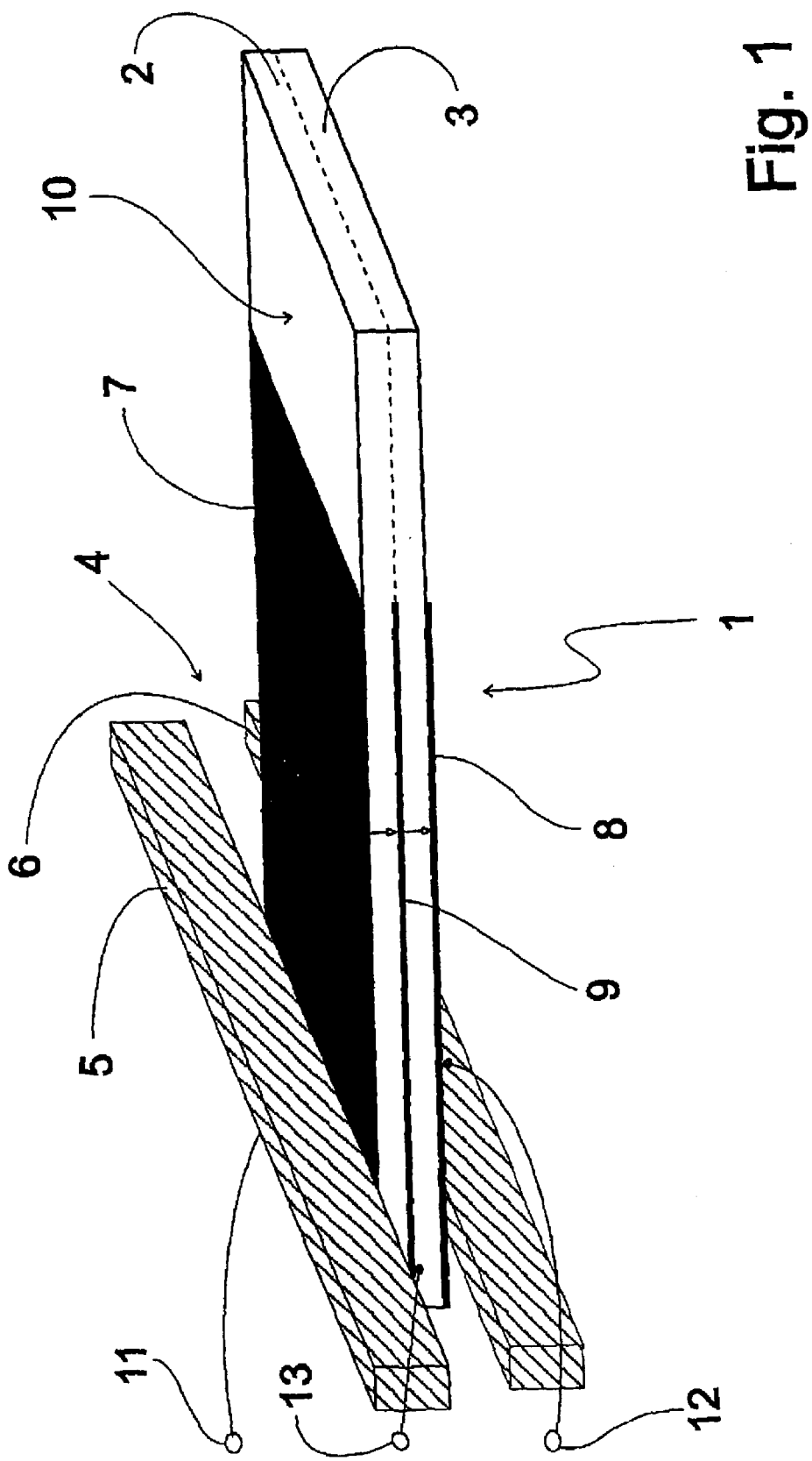
FIG. 1 is a perspective view of a piezo plate having two piezo layers in which the spontaneous polarization has the same orientation.

FIG. 1 is a perspective view of a first exemplary embodiment of the invention. The exemplary embodiment of FIG. 1 comprises a flat piezo plate 1 that has a rectangular base surface and contains two individual piezo layers 2, 3 in which the spontaneous polarization has the same orientation, perpendicular to the plane of said piezo layers 2, 3. At a first narrow end side, piezo plate 1 is clamped into a mounting unit 4 by means of two mounting bars 5, 6.

Each piezo layer 2, 3 is provided on its outward-facing large side with an outer electrode 7, 8 as a piezo electrode. A middle electrode 9 is also provided as a piezo electrode between piezo layers 2, 3. Each outer electrode 7, 8 and middle electrode 9 extend from the first narrow end side toward the opposite, second narrow end side, an end portion 10 of the second narrow end side being free of outer electrodes 7, 8 and middle electrode 9.

Each outer electrode 7, 8 is connected electrically to an assigned outer-electrode contact 11, 12, while middle electrode 9 is connected electrically to a middle-electrode contact 13. The application of a voltage in the medium voltage range between middle-electrode contact 13 and each outer-electrode contact 11, 12, using voltages of opposite polarity, drives piezo plate 1 to flex longitudinally about the transverse axis in the region of outer electrodes 7, 8 and middle electrode 9.

Figure 2:
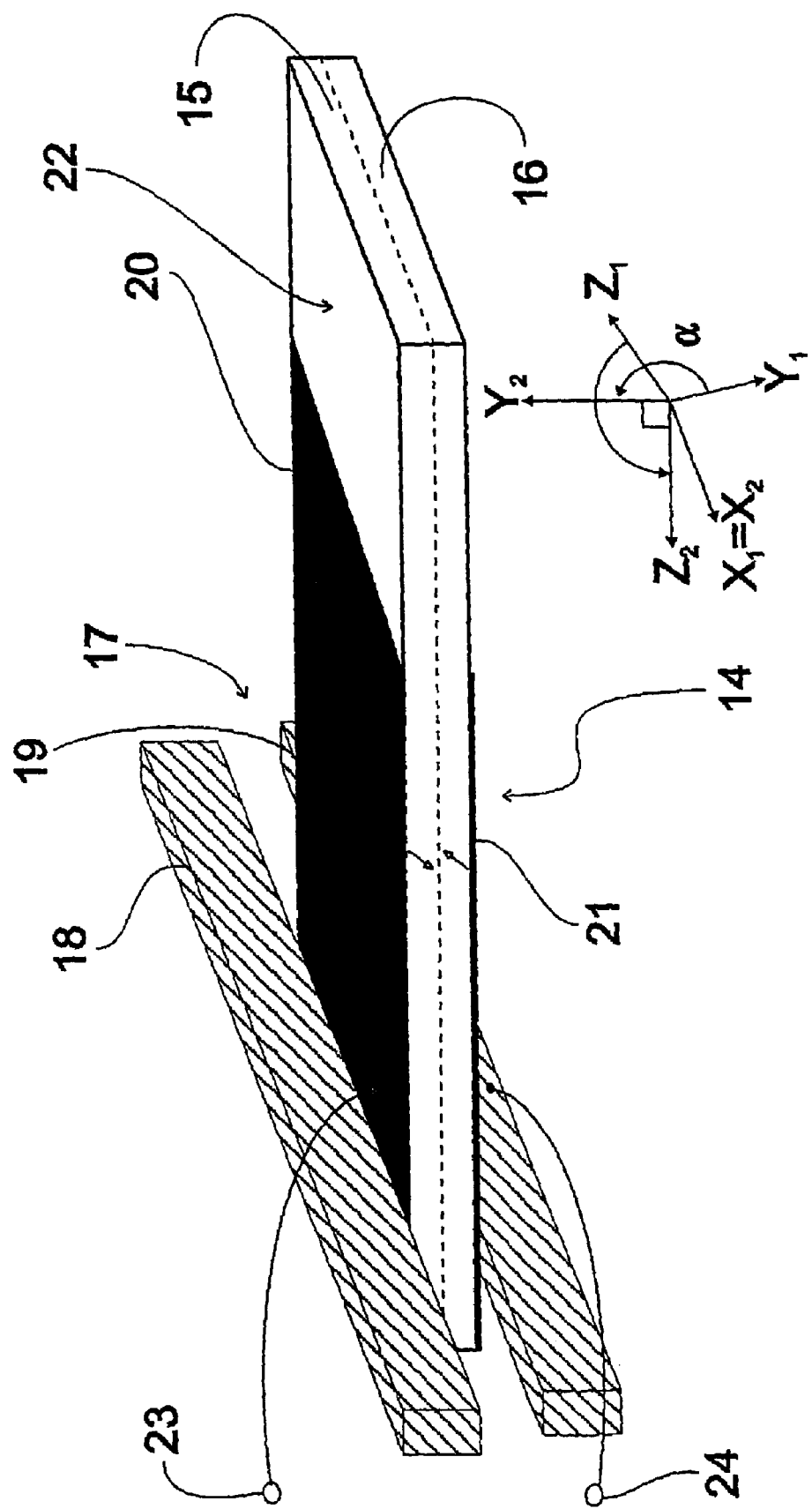
FIG. 2 is a perspective view of a second exemplary embodiment of the invention, comprising a piezo plate having two piezo layers in which the spontaneous polarization is of opposite orientation.

FIG. 2 is a perspective view of a second exemplary embodiment of the invention. In the following explanation, data subscripted "1" refer to the crystal coordinate system and data subscripted "2" refer to the coordinate system of the piezo plate. The exemplary embodiment of FIG. 2 includes a flat, crystalline, $Y_2$-cut piezo plate 14 having a rectangular base surface and comprising two piezo layers 15, 16, the spontaneous polarization in the plane of piezo layers 15, 16 being oriented in opposite directions. Piezo layers 15, 16 are, for example, fabricated by heating to effect local domain inversion. $Z_2$ axes of the cartesian coordinate system of the piezo crystal are oriented parallel to the long side of the piezo plate 14, while the $Y_2$ axis of the piezo plate 14 is rotated with respect to the $Y_1$ crystal axis by an angle of typically about 120° to 160°, with the coincident $X_1$ and $X_2$ axes as the axis of rotation. As in the first exemplary embodiment, described with reference to FIG. 1, the piezo plate 14 is clamped by a first narrow end side into a mounting unit 17 by means of two mounting bars 18, 19.

Each piezo layer 15, 16 of piezo plate 14 according to the second exemplary embodiment is occupied on its outward-facing large side by an outer electrode 20, 21 as a piezo electrode. Each outer electrode 20, 21 extends from the first narrow end side toward the opposite, second narrow end side, an end portion 22 of the second narrow end side remaining free of outer electrodes 20, 21.

Each outer electrode 20, 21 is connected electrically to an assigned outer-electrode contact 23', 24. The application of a voltage in the medium voltage range between outer-electrode contacts 23, 24 drives piezo plate 14 to flex longitudinally about the transverse axis in the region of outer electrodes 20, 21.

Figure 3:
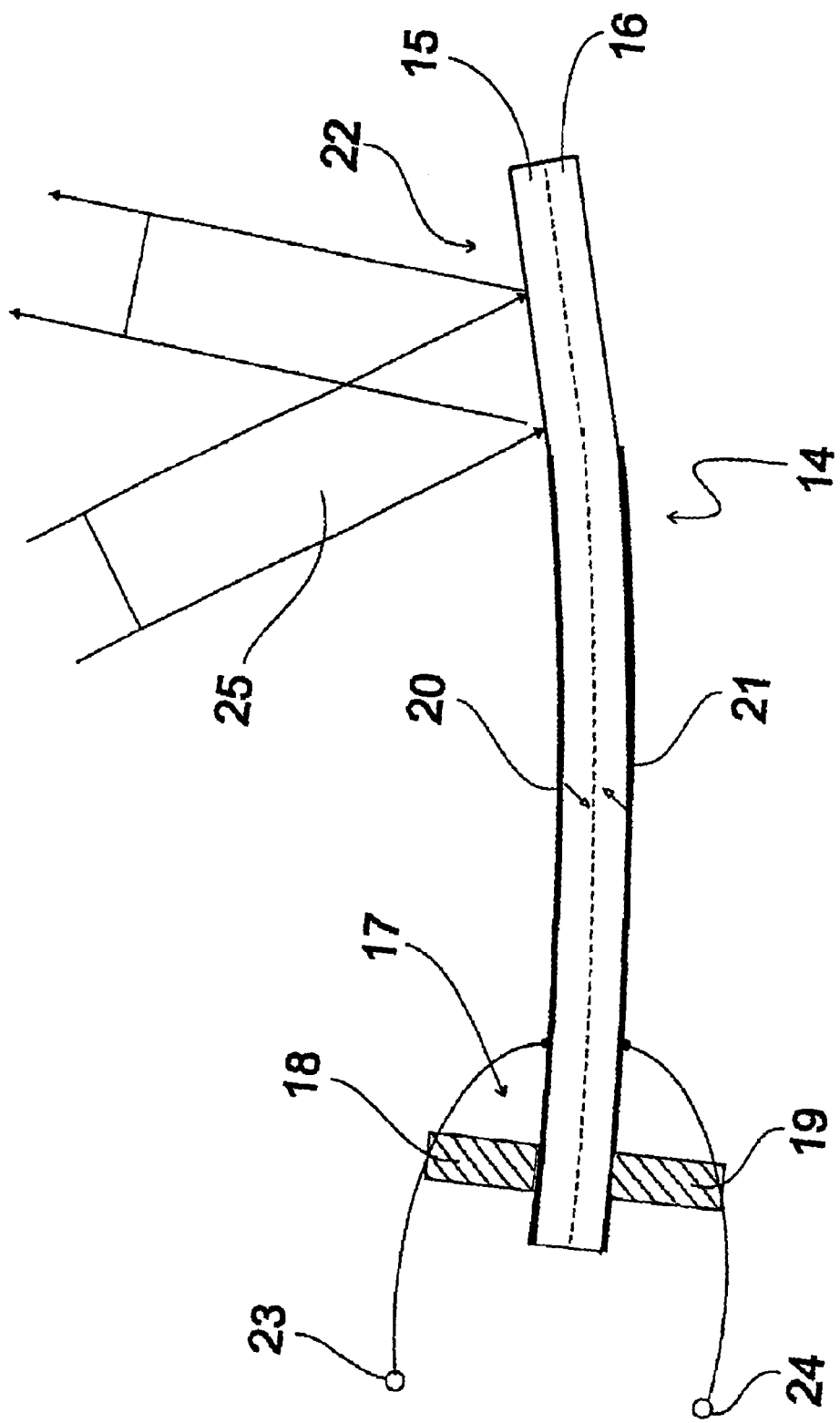
FIG. 3 is a side view of the embodiment of FIG. 2 during the deflection of a light beam.

FIG. 3 is a side view of the second exemplary-embodiment according to FIG. 2 during the deflection of a light beam 25 incident, with a planar wavefront, for example, on end portion 22 free of outer electrodes 20, 21. When a voltage is applied between outer-electrode contacts 23, 24, piezo plate 14 flexes only in the region of outer electrodes 20, 21, while end portion 22 struck by light beam 25 remains planar except in a comparatively narrow region of transition to the outer electrodes 20, 21. This results in a reflection behavior similar to that of a plane mirror, and the reflected wavefront is not deformed with respect to the incident wavefront.

Similar flexural behavior is demonstrated by the piezo plate 1 of the first exemplary embodiment, depicted in FIG. 1.

Figure 4:
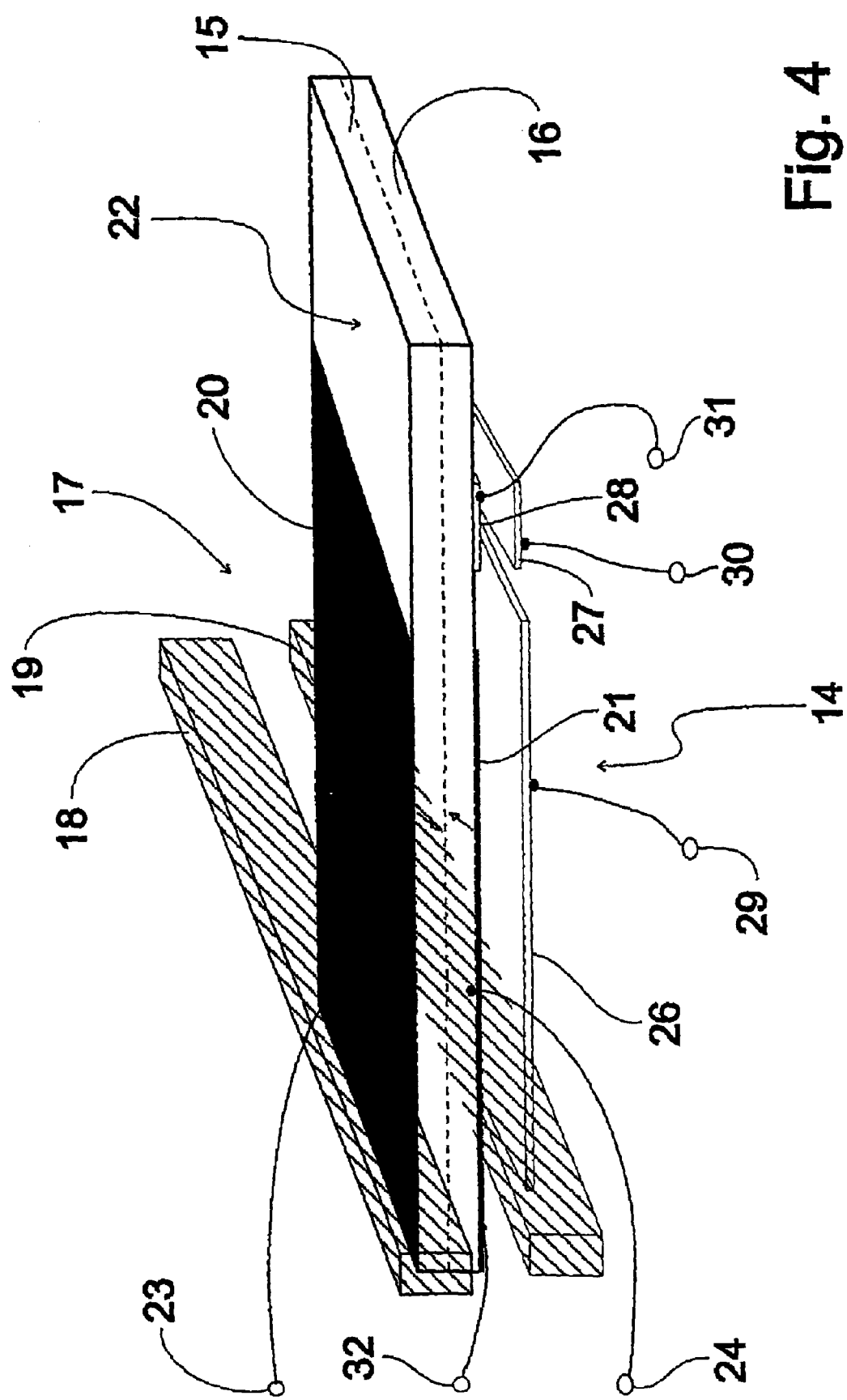
FIG. 4 is a perspective view of a third exemplary embodiment of the invention, comprising capacitive electrodes.

FIG. 4 is a perspective view of a third exemplary embodiment of the invention, which is presented as an improvement of the second exemplary embodiment described with reference to FIGS. 2 and 3. It is understood that the improving features can also be provided in connection with the first exemplary embodiment, described with reference to FIG. 1. In the third exemplary embodiment, depicted in FIG. 4, a plate-like first counterelectrode 26, an elongated second electrode 27, and an elongated supplementary electrode 28 are provided. First counterelectrode 26 is arranged to confront an outer electrode 20, 21. Supplementary electrode 28 is disposed on an outer face of a piezo layer 15, 16, for example roughly in the center of end portion 22, and extends transversely with respect to piezo plate 14. Second counter-electrode 27 confronts supplementary electrode 28. The mutually confronting outer electrodes 20, 21 and first counterelectrode 26 and the mutually confronting supplementary electrode 28 and second counterelectrode 27 form capacitively functioning electrodes.

Counterelectrodes 26, 27 are connected electrically to a first counterelectrode contact 29 and a second counterelectrode contact 30, respectively. Supplementary electrode 28 is connected electrically to a supplementary-electrode contact 31, while, in addition, outer electrode 21 confronting first counterelectrode 26 is connected to an outer-electrode supplementary contact 32.

The application of a voltage, typically in the medium voltage range, to first counterelectrode contact 29 and outer-electrode supplementary contact 32 and to second counter-electrode contact 30 and supplementary-electrode contact 31 causes forces to be exerted on piezo plate 14, as a function of the polarity of the applied voltage, between the associated outer electrode 21 and first counterelectrode 26 and between supplementary electrode 28 and second counterelectrode 27; these forces are superimposed on the piezoelectrically exerted forces and, especially if the polarity is appropriate, amplify the deflection.

In modifications of the third exemplary embodiment described with reference to FIG. 4, only one pair is provided out of confronting outer electrodes 21 and first counterelectrode 26 and confronting supplementary electrode 28 and second counterelectrode 27.

Figure 5:
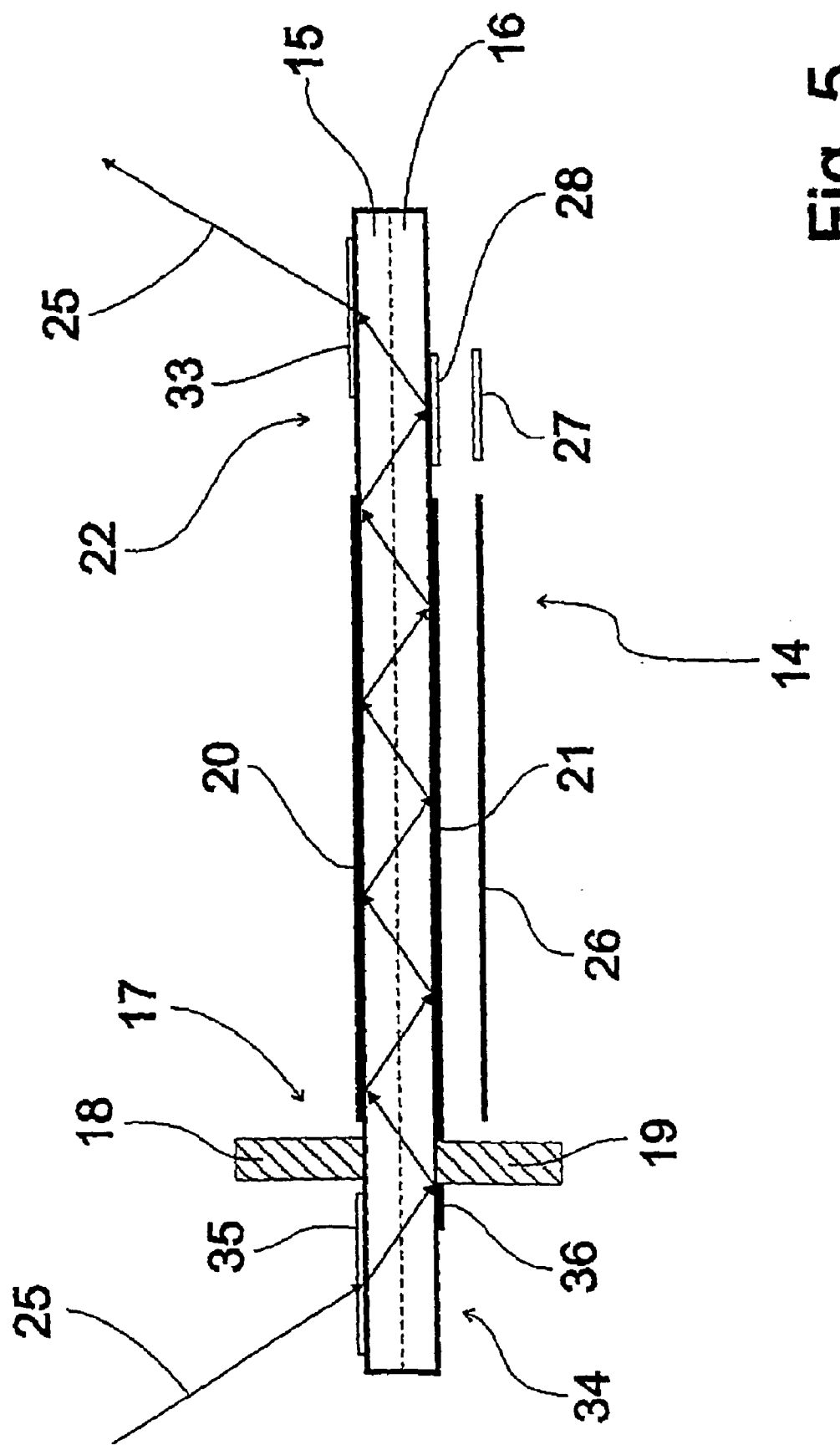
FIG. 5 is a perspective view of a fourth exemplary embodiment of the invention, comprising an internal beam guiding arrangement.

FIG. 5 is a perspective view of a fourth exemplary embodiment of the invention, which includes some of the features of the third exemplary embodiment described with reference to FIG. 4; these features have been given the same reference numerals and will not be described in more detail below. The fourth exemplary embodiment of FIG. 5 includes highly reflective outer electrodes 20, 21. A decoupling antireflection coating 33 has been deposited in end portion 22 free of outer electrodes 20, 21. In addition, the piezo plate 14 projects by an incoupling portion 34 beyond mounting unit 17. Incoupling portion 34 is provided with an incoupling antireflection coating 35 and a reflection coating 36, by means of which a light beam 25 can be coupled into piezo plate 14. After multiple reflections on outer electrodes 20, 21, light beam 25 exits piezo plate 14 without deformation through decoupling antireflection coating 33 in end portion 22 free of outer electrodes 20, 21. The exit direction depends on the electrical drive and the associated flexure of the piezo plate 14 longitudinally about the transverse axis.

FIGS. 6 and 7 are a lateral and a plan view, respectively, of a fifth exemplary embodiment of the invention, comprising a piezo plate 37 that has the same piezoelectric structure as piezo plate 14 described with reference to FIG. 2, taking the form of two piezo layers 38, 39 with the spontaneous polarization in the plane of said piezo layers 38, 39 oriented in opposite directions. Piezo plate 37 is realized with two outwardly projecting arms 40, 41 in its middle region. The arms 40, 41 are engaged with a tilt mounting 42 by means of which piezo plate 37 is swivelably mounted.

As in the previously described exemplary embodiments, disposed on the one side of piezo plate 37 as piezo electrodes are outer electrodes 43, 44, which extend from tilt mounting 42 into an end region 45 free of outer electrodes 43, 44, to permit the reflection of a beam 46 without deformation and with the ability to control the direction of reflection.

Arranged to confront each other in the end portion on the other side of piezo plate 37 are a supplementary electrode 47 and a counterelectrode 48, to which, as capacitively functioning electrodes, an electrical voltage in the medium voltage range can be applied.

The driving of outer electrodes 43, 44, supplementary electrode 47 and counterelectrode 48, causes piezo plate 37 to flex longitudinally about the transverse axis and to tilt about arms 40, 41.

Figure 8:
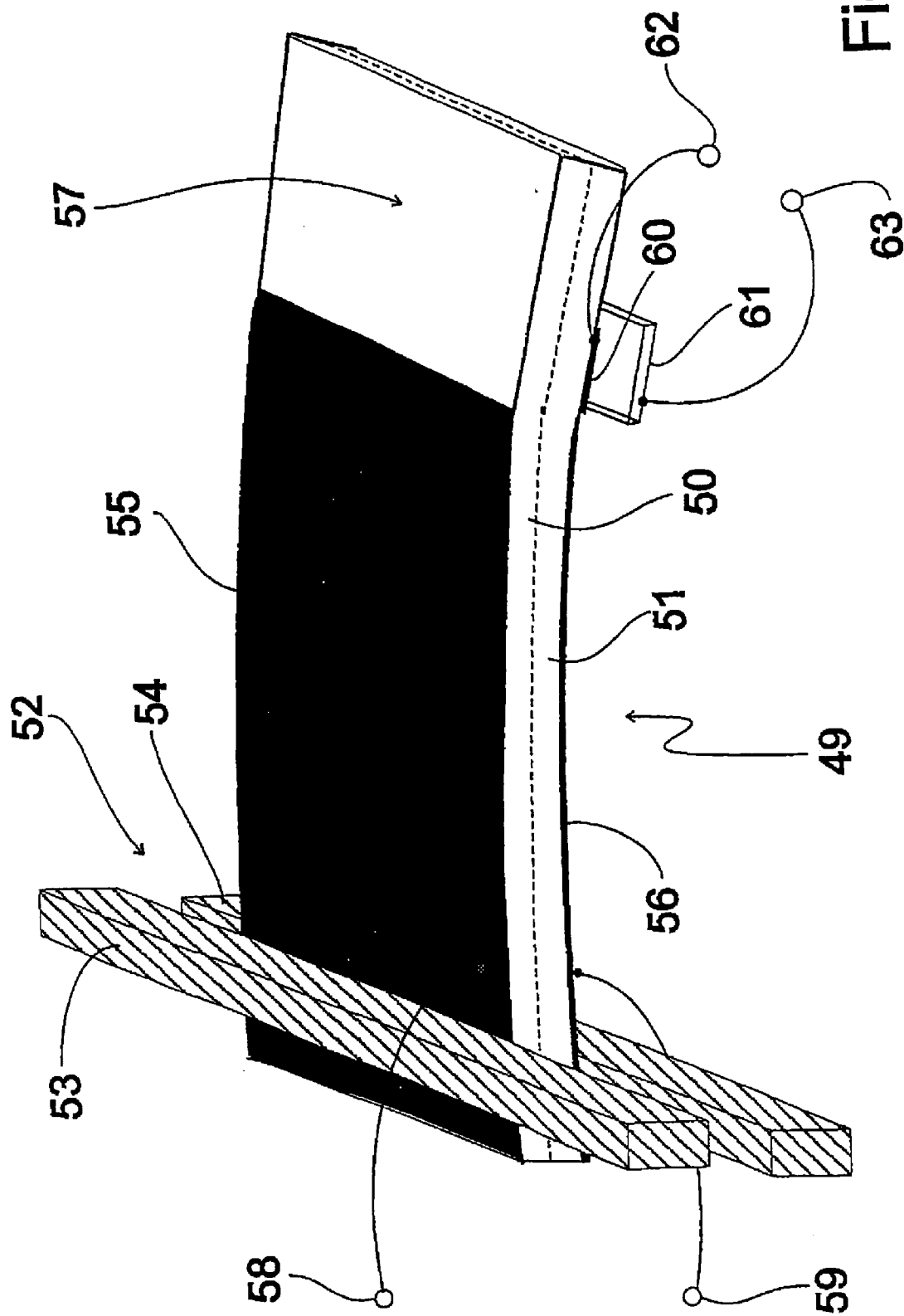
FIG. 8 is a perspective view of a sixth exemplary embodiment for two-dimensional deflection.

FIG. 8 is a perspective view of a sixth exemplary embodiment for two-dimensional deflection of a beam, comprising a flat, crystalline piezo plate 49 with a rotated $Y_2$ cut and a rectangular base surface, comprising two piezo layers 50, 51. The $Z_2$ axis of the Cartesian coordinate system of the piezo crystal is oriented at an angle of approximately 40° to approximately 60° with respect to the long side of piezo plate 49, The spontaneous polarizations of piezo layers 50, 51 are of opposite directions in the piezo plate 49 of the sixth exemplary embodiment, and are produced, for example, by heating to effect local domain inversion. The piezo plate 49 is clamped by a first narrow end side in a mounting unit 52 comprising two mounting bars 53, 54.

Each piezo layer 50, 51 of the piezo plate 49 according to the sixth exemplary embodiment is occupied on its outward-facing large side by an outer electrode 55, 56 as a piezo electrode. Each outer electrode 55, 56 extends from the first narrow end side toward the opposite, second narrow end side, an end portion 57 of the second narrow end side remaining free of outer electrodes 55, 56.

Each outer electrode 55, 56 is connected electrically to an assigned outer-electrode contact 58, 59. The application of a voltage in the high-voltage range between outer-electrode contacts 58, 59 drives piezo plate 49 to twist about the longitudinal axis in the transverse direction in the region of outer electrodes 55, 56, so that the end portion 57 can be tilted parallel to mounting unit 52 and a beam incident on end portion 57 can be deflected in a given direction.

In addition, mounted on a large side of end portion 57 is a supplementary electrode 60, which with a counterelectrode 61 spacedly confronting it forms a capacitively functioning electrode pair. Supplementary electrode 60 is connected electrically to supplementary-electrode contact 62, while counterelectrode 61 is connected to a counterelectrode contact 63. When supplementary electrode 60 and counterelectrode 61 are driven by means of a voltage in the low-voltage range, piezo plate 49 is flexed longitudinally about the transverse axis. When the flexure that can be generated by supplementary electrode 60 and counterelectrode 61 is superimposed on the tilt that can be induced by means of outer electrodes 55, 56, the result is two-dimensional deflection of a beam incident on end portion 57.

In an exemplary embodiment not shown, to achieve two-dimensional deflection, two devices according to the invention, for example according to one of the exemplary embodiments of FIGS. 1 to 7, are arranged with respect to each other so that the directions of flexure can be oriented perpendicular to each other.

Figure 9:
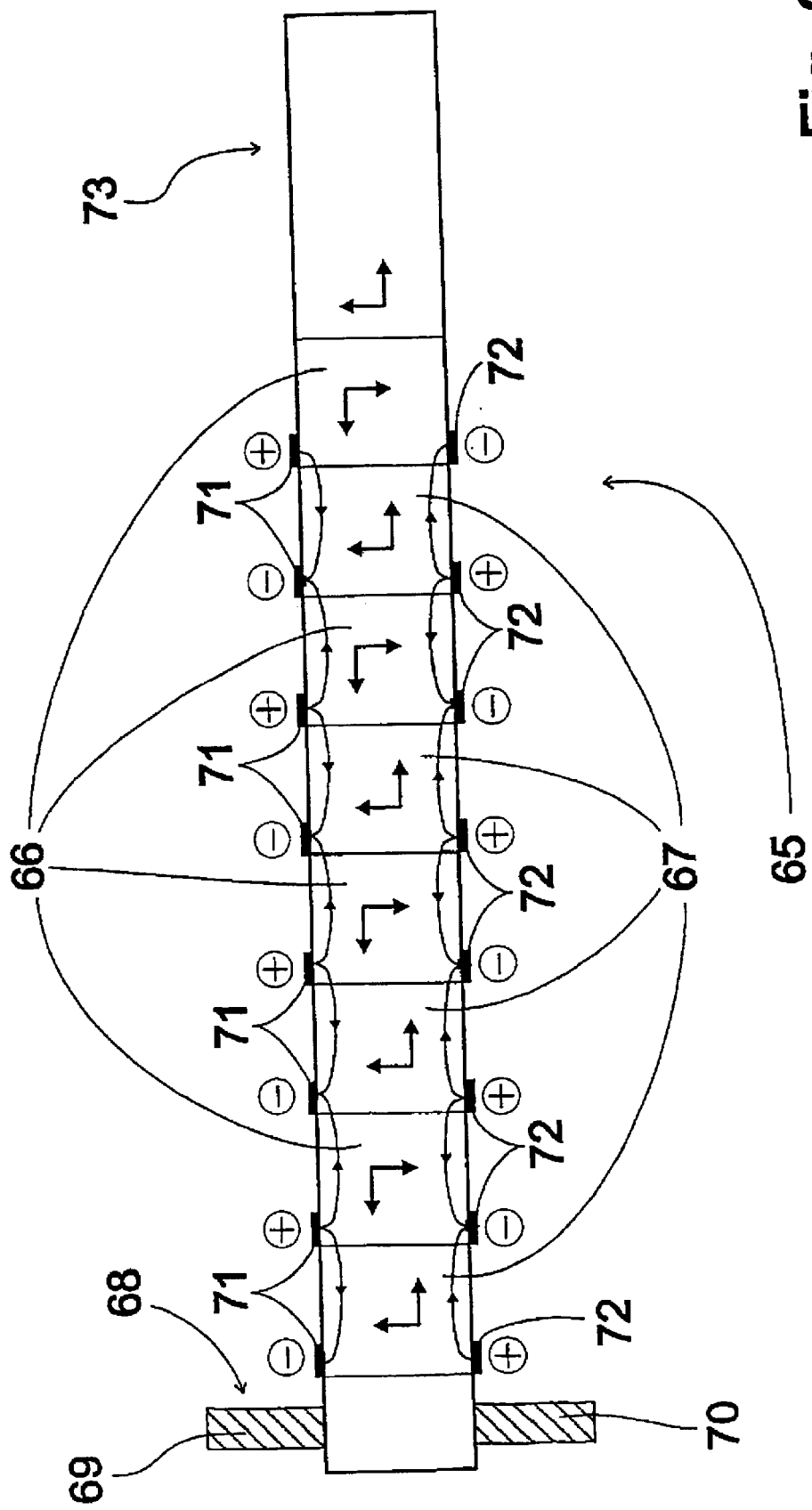
FIG. 9 is a side view of a seventh exemplary embodiment of the invention, comprising regions of alternating orientation.

FIG. 9 is a side view of a seventh exemplary embodiment of the invention. The seventh exemplary embodiment depicted in FIG. 9 comprises a piezo plate 65 fabricated from a $Z_1$-cut crystal. The piezo plate 65 is realized with a number of strip-like first domains 66 and second domains 67 extending over the entire thickness as regions of orientation, the orientation of the piezoelectrically operative axes being the same in each case. In the piezo plate 65, the $Y_1$ axes of the domains 66, 67 are oriented parallel to the long side, whereas by domain inversion the $Z_1$ axes of the first domains 66 have been oriented oppositely to the $Z_1$ axes of the second domains 67. The $Y_1$ axes of domains 66, 67 are therefore also oriented oppositely to each other. The piezo plate 65 is clamped at a first narrow end side in a mounting unit 68 comprising two mounting bars 69, 70.

Provided as piezo electrodes along the edge regions of a number of domains 66, 67, on both large sides of piezo plate 65, are strip-like strip electrodes 71, 72 that are narrow in comparison to the width of the domains 66, 67, with an end portion 73 remaining free of strip electrodes 71, 72. Voltages of alternating polarity in the medium-voltage range can be applied to a large side of each of the adjacently arranged strip electrodes 71, 72, and mutually confronting strip electrodes 71, 72 on different large sides can also be subjected to voltages of alternating polarity. This causes piezo plate 65 to flex longitudinally about the transverse axis in the region of strip electrodes 71, 72 according to the magnitude of the applied voltages, while the end portion 73 free of strip electrodes 71, 72 remains substantially planar.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A device for deflecting optical beams, said device comprising a substantially planar piezo plate, said plate including a plurality of planar piezoelectric layers and a plurality of piezo electrodes disposed on exterior surfaces of said layers, said electrodes operative to drive said piezo plate, said planar layers defining continuous flat exterior areas extending to a front side of said piezo plate, each said exterior areas having an end portion, said end portions substantially equal in size and contiguous with each other and defining a planar end portion of said plate, said planar end portion entirely free of said piezo electrodes.

2. The device of claim 1 wherein said piezo plate further includes parallel bands of regions of orientation which extend over the thickness of said piezo plate, and wherein spontaneous polarization of adjacent regions of orientation is oppositely oriented in pairs of said regions, said piezo electrodes comprising strip-like electrodes extending on edge sides of said regions of orientation.

3. The device recited in claim 1 wherein said piezo plate comprises two piezo layers, each said layer having an outer large side, a plate-like piezo electrode disposed on each said outer large side.

4. The device recited in claim 3 wherein said two piezo layers exhibit uniformly oriented spontaneous polarization directed perpendicularly to the planes of said piezo layers, a middle plate-like piezo electrode disposed between said piezo layers.

5. The device recited in claim 3 wherein said piezo layers exhibit oppositely oriented spontaneous polarization directed in the planes of the piezo layer.

6. The device recited in claim 1 wherein a highly reflective coating is deposited on said planar end portion.

7. The device recited in claim 5 further comprising an incoupling portion which is free of piezo electrodes, a middle portion extending between said end portion and said incoupling portion, a highly reflective coating disposed on said middle portion.

8. The device recited in claim 1 wherein said plurality of electrodes interact capacitively with said piezo plate.

9. The device recited in claim 8 including a plurality of arms disposed on said piezo plate in said middle region, said piezo electrodes disposed on first sides of said arms, said plate further including a plurality of second electrodes disposed at least on second sides of said arms, said second electrodes capacitively interacting with said piezo plate.

* * * * *